(12) United States Patent
Manstretta

(10) Patent No.: US 7,724,085 B2
(45) Date of Patent: May 25, 2010

(54) IMPEDANCE MATCHED VARIABLE GAIN LOW NOISE AMPLIFIER USING SHUNT FEED-BACK

(75) Inventor: Danilo Manstretta, Stradella (IT)

(73) Assignee: Broadcom Corporation, Irvine, CA (US)

( * ) Notice: Subject to any disclaimer, the term of this patent is extended or adjusted under 35 U.S.C. 154(b) by 100 days.

(21) Appl. No.: 11/984,620

(22) Filed: Nov. 20, 2007

(65) Prior Publication Data
US 2008/0068076 A1    Mar. 20, 2008

Related U.S. Application Data

(63) Continuation of application No. 11/295,431, filed on Dec. 7, 2005, now Pat. No. 7,301,394.

(60) Provisional application No. 60/635,174, filed on Dec. 13, 2004.

(51) Int. Cl.
*H03F 3/68* (2006.01)
(52) U.S. Cl. .......................... 330/85; 330/260; 330/291
(58) Field of Classification Search .................. 330/85, 330/260, 291
See application file for complete search history.

(56) References Cited

U.S. PATENT DOCUMENTS

| | | | |
|---|---|---|---|
| 3,662,276 A | 5/1972 | Hyer | |
| 3,737,798 A | 6/1973 | Faraguet et al. | |
| 4,322,687 A * | 3/1982 | Dwarakanath et al. | 330/9 |
| 4,607,235 A * | 8/1986 | Seevinck | 330/298 |
| 4,634,986 A * | 1/1987 | Brookshier | 327/350 |
| 5,327,027 A | 7/1994 | Taylor | |
| 6,538,507 B2 | 3/2003 | Prentice et al. | |
| 6,763,228 B2 * | 7/2004 | Prentice et al. | 455/127.2 |
| 7,064,605 B2 | 6/2006 | Westwick et al. | |
| 7,082,004 B2 * | 7/2006 | Kajiyama et al. | 360/46 |
| 7,253,680 B2 * | 8/2007 | Laletin | 330/69 |
| 7,301,394 B2 | 11/2007 | Manstretta | |
| 7,536,107 B2 * | 5/2009 | Paillet et al. | 398/140 |

* cited by examiner

*Primary Examiner*—Patricia Nguyen
(74) *Attorney, Agent, or Firm*—Sterne, Kessler, Goldstein & Fox P.L.L.C.

(57) ABSTRACT

The variable gain amplifier includes a forward path that provides the amplifier variable gain, and a feedback path. The feedback path uses a switch that is turned on at low gain levels. The switch taps into the feedback resistor, shunting it to signal-ground and eliminating the feedback mechanism. This ensures that the input impedance seen at the input port does not grow excessively, using part of the feedback resistor as a passive termination at low gain levels. In this way variable gain ranges in excess of 30 dB can be achieved.

15 Claims, 4 Drawing Sheets

FIG. 1: Prior Art

IMPEDANCE MATCHED VARIABLE GAIN LOW NOISE AMPLIFIER USING SHUNT FEED-BACK

CROSS REFERENCED TO RELATED APPLICATIONS

This application is a continuation of U.S. patent application Ser. No. 11/295,431, filed on Dec. 7, 2005, which claims the benefit of U.S. Provisional Patent Application No. 60/635,174, filed Dec. 13, 2004, both of which are incorporated herein by reference in its entirety.

BACKGROUND OF THE INVENTION

1. Field of the Invention

The present invention relates to amplifiers using shunt-feedback, for example low noise amplifiers having shunt-feedback.

2. Background Art

Various RF input circuits include front-ends that require a large variable gain range. In all applications where a large variable gain range is required, such as TV front-ends, low noise amplifiers (LNAs) typically do not use feedback. This leads to lower dynamic range, higher noise, lower intercept point and higher power consumption.

The use of resistive shunt feedback can improve the dynamic range (which is proportional to the ratio of the intercept point and the noise figure) of an impedance matched low noise amplifier. However, the use of feedback in an impedance-matched variable gain amplifier is complicated because, as the gain varies, so does the input impedance, limiting the variable gain range to a few dBs (typically less than 6 dB). In fact the input impedance is given by the feedback resistance divided by 1 plus the amplifier gain ($R_f/(1+A)$).

Therefore, what is needed is an impedance-matched variable gain amplifier that includes a feedback mechanism to improve the dynamic range, but that does not adversely effect the input impedance.

BRIEF SUMMARY OF THE INVENTION

The present invention includes an impedance-matched variable gain amplifier having a switchable feedback mechanism that is controlled based on the gain settings of the variable gain amplifier. The switchable feedback mechanism provides feedback to improve dynamic range for all applications except for low gain applications. For low gain applications, the feedback mechanism is disengaged, so that no feedback is provided, and therefore the input impedance is not detrimentally affected for low gain applications.

In one embodiment, the impedance-matched variable gain amplifier includes a forward path that provides the amplifier variable gain, and a feedback path. The feedback path uses a switch that is turned on at low gain levels. The switch taps into the feedback resistor, shunting it to signal-ground and eliminating the feedback mechanism. This ensures that the input impedance seen at the input port does not grow excessively, using part of the feedback resistor as a passive termination at low gain levels. In this way variable gain ranges in excess of 30 dB can be achieved.

In one embodiment, the impedance-matched variable gain amplifier is differential, and includes a differential forward variable gain amplifier having a differential input and a differential output, where a differential feedback path is coupled across the differential input and the differential output. The differential feedback path includes a differential feedback fixed-gain amplifier, a first differential resistor coupled to an output of the differential feedback amplifier, and a means for shorting a first terminal of the first differential resistor to a second terminal of the first differential resistor, and a second differential resistor coupled between the first differential resistor and to the differential input.

In one embodiment, the means for shorting includes a switch coupled across the differential terminals of the first differential resistor, where the switch is closed for low gain applications, so as to short-out a feedback signal associated with the feedback path. Stated another way, the feedback signal is shunted to virtual ground by the switch for low gain applications.

Further features and advantages of the present invention, as well as the structure and operation of various embodiments of the present invention, are described in detail below with reference to the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Figure 1:
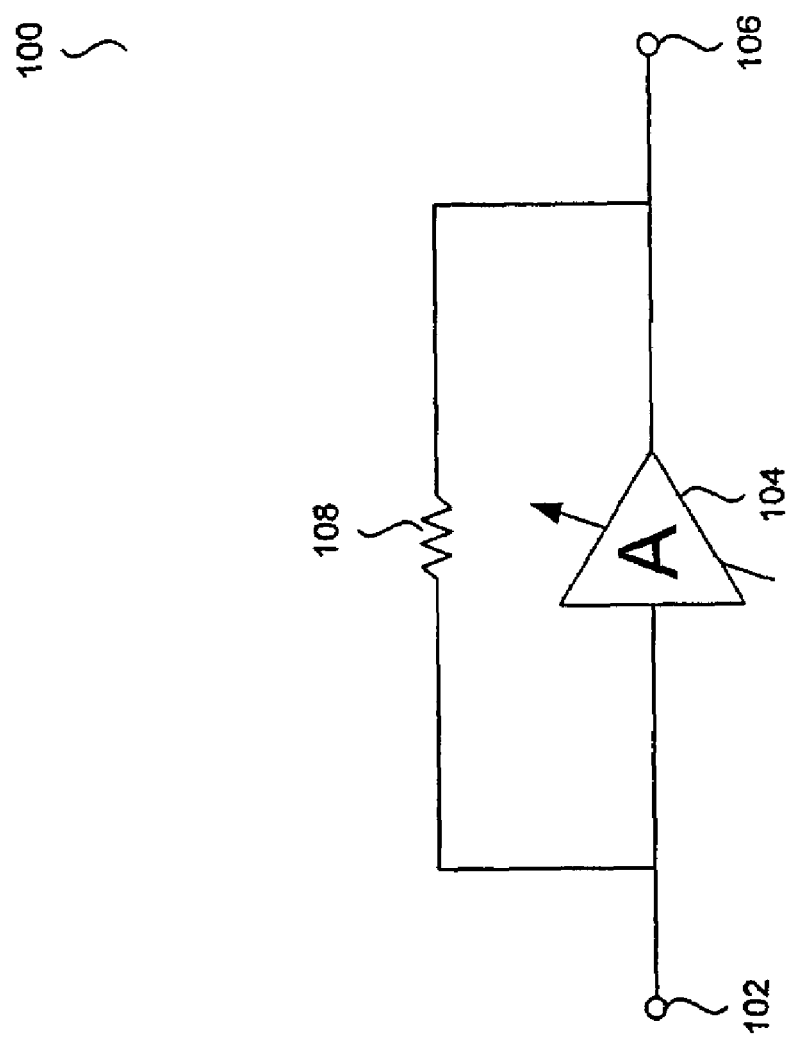
FIG. 1 illustrates a conventional feedback amplifier.

FIG. 1 illustrates a conventional amplifier 100 having resistive feedback. The amplifier 100 includes a forward amplifier 102, and a resistor 108. The amplifier 104 is a variable gain amplifier that is preferably matched to an input port 102 and an output port 106.

The use of resistive shunt feedback can improve the dynamic range (which is proportional to the ratio of the intercept point and the noise figure) of an impedance matched low noise amplifier. However, the use of feedback in an impedance-matched variable gain amplifier is complicated because, as the gain varies, so does the input impedance, limiting in practice the variable gain range to a few dBs (typically less than 6 dB). In fact, the input impedance is given by: the feedback resistance divided by 1 plus the amplifier gain. (Input impedance=($R_f/(1+A)$). Accordingly, the input impedance at node 102 varies as the gain A of the forward amplifier 104 is varied. Specifically, as the gain A drops, the input impedance at node 102 increases, and can become quite large. This is undesirable for an impedance matched amplifier system, and limits the practical gain variation to a few dBs as discussed above.

Figure 2:
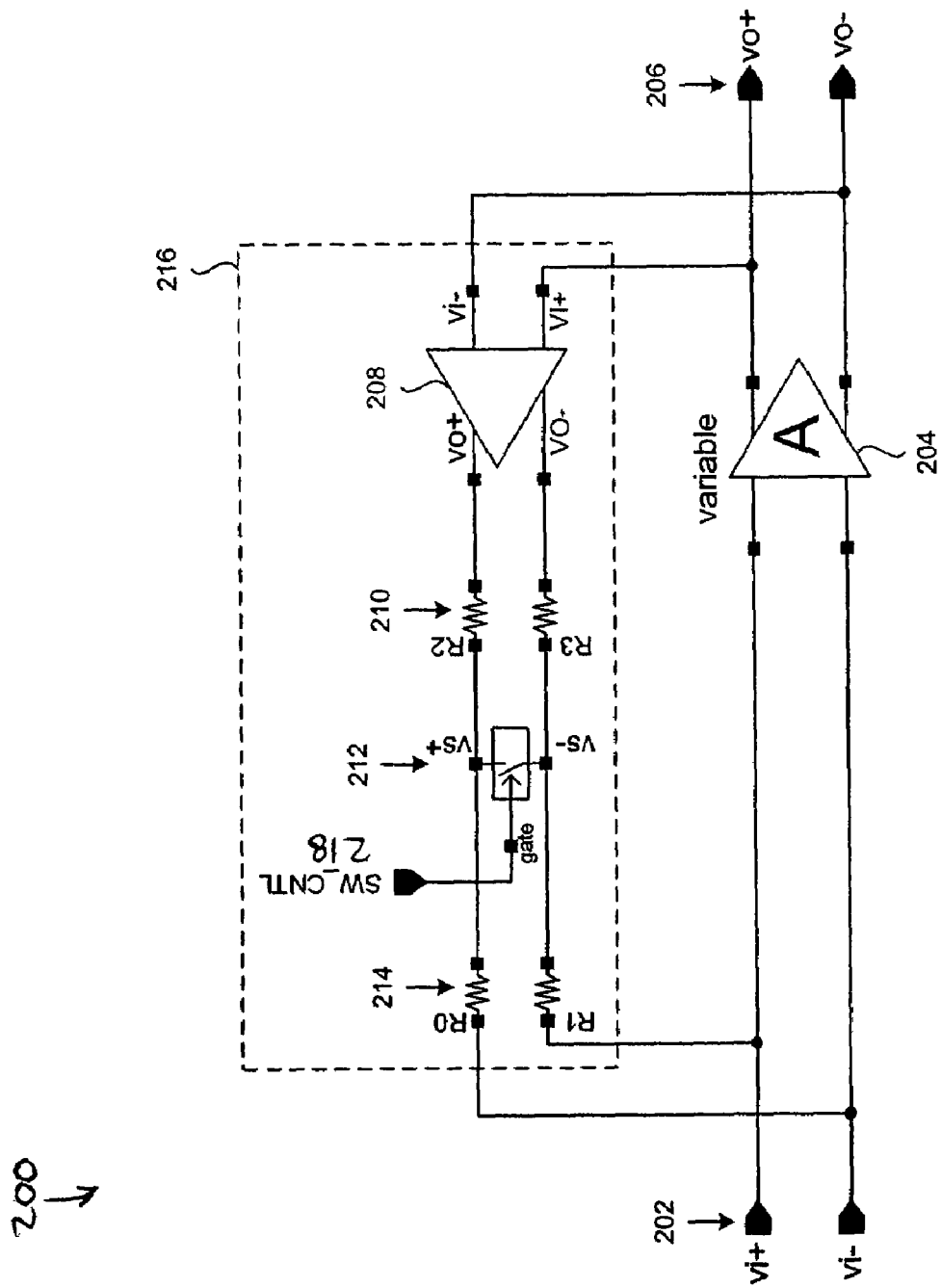
FIG. 2 illustrates a feedback amplifier, according to embodiments of the present invention.

FIG. 2 illustrates a variable gain amplifier 200 according to embodiments of the present invention. As will be discussed below, the impedance-matched variable gain amplifier 200 includes a switchable feedback mechanism that is controlled based on the gain settings of the variable gain amplifier 200. Accordingly, the switchable feedback mechanism provides feedback to improve dynamic range for all applications except for low gain applications. For low gain applications, the feedback mechanism is disengaged, so that no feedback is provided, and therefore the input impedance is not adversely affected.

FIG. 2 illustrates a variable gain amplifier 200 according to embodiments of the present invention. Amplifier 200 includes a differential forward variable gain amplifier 204 and a differential feedback path 216 between an output port 206 and an input port 202. The feedback path 216 includes a differential feedback amplifier 208, a first differential resistor 210, a switch 212, and a second differential resistor 214, which are all series connected. In one embodiment, the differential feedback amplifier 208 is a fixed gain amplifier. Preferably, the amplifier 200 is impedance matched at the input port 202. The first differential resistor 210 and the second differential resistor 214 can be referred to as a first component resistor and a second component resistor, respectively, or a first resistor portion and a second resistor portion, as will be understood by those skilled in the arts.

It is noted that the amplifier 200 is a differential amplifier having a differential input 202, a differential output 204, and a differential feedback path 216. However, the invention is not limited to a differential configuration, and just as well could be a single ended amplifier system as will be understood by those skilled in the arts.

As discussed above, the use of resistive feedback via differential resistors 210 and 214 improves dynamic range, but affects the input impedance at the input port 202, especially at low gain levels. Accordingly the present invention uses a switch in the feedback path that is closed for low gain settings, but is opened for all other gain settings. Referring to FIG. 2, the feedback path 216 includes a switch 212 that is controlled by a switch control 218. The switch 212 taps into the feedback resistor formed by resistors 214 and 210, shunting it to signal-ground and eliminating the feedback action for low amplifier gain settings. Specifically, the switch 112 shorts together the differential components vs⁻ and vs⁺ of the feedback signal at the output terminals of the first differential resistor 210, effectively shorting the feedback signal to virtual ground, and therefore eliminating the feedback signal. This ensures that the input impedance seen at the input port 202 does not grow excessively. Further, by splitting the feedback resistance into two resistors 210 and 214, the first feedback resistor 210 provides a passive termination at low gain levels. Specifically, the differential resistor 210 provides a passive termination when the switch 212 is closed because the closed switch becomes a virtual ground. As a result, the feedback mechanism is eliminated for low gain levels, so that the input impedance seen at the input port 202 is not affected. In this way, variable gain ranges in excess of 30 dB can be achieved.

As discussed above, the switch 212 is closed to eliminate the feedback signal carried by the feedback path 216 for low gain applications. For example, the feedback can be eliminated for a predetermined gain level below the maximum gain of the amplifier 200. In one embodiment, the switch 212 is closed and the feedback is eliminated for a gain of 5-6 dB below the maximum gain of the amplifier 200, which represents the low gain application for this particular example. Other gain differentials, from maximum gain or any other gain reference, could be chosen without limiting the invention described herein as will be understood by those skilled in the arts.

During operation, the forward amplifier 204 receives and amplifies a differential input signal received at the input port 202, to produce a differential amplified signal at the output port 206. As discussed above, the amplifier 204 is a variable gain amplifier. The differential amplified signal is feedback via the differential feedback path 216 to the differential input port 202 for non-low gain applications. Specifically, the differential amplifier 208 amplifies the feedback signal, the output of which is coupled to the differential input port 202 through the differential resistors 210 and 214. The differential amplifier 208 is preferably fixed gain in one embodiment. The switch 212 is coupled to the output of the differential resistor 210. Accordingly, the switch 212 is controlled by the switch control signal 218 based on the relative gain setting of the forward amplifier 204 so as to improve dynamic range without affecting low gain impedance. Namely, the switch 212 is closed for relatively low gain settings shorting the differential terminals at the output of the first differential resistor 210, but the switch is opened for all other gain settings.

By closing the switch 212 for low gain settings, the differential components (vs⁺ and vs⁻) are shorted together, and the feedback signal is eliminated for low gain settings. Therefore, the input impedance is not affected by the low gain as indicated above. However, the switch 212 is opened for non-low gain settings, allowing the differential feedback signal to reach the input port 202, which improves dynamic range and intercept point.

The invention allows the use of feedback in low-noise variable gain amplifiers that cover large variable gain ranges. This leads to the reduction of power consumption while achieving lower noise and a higher intercept point.

Figure 3:
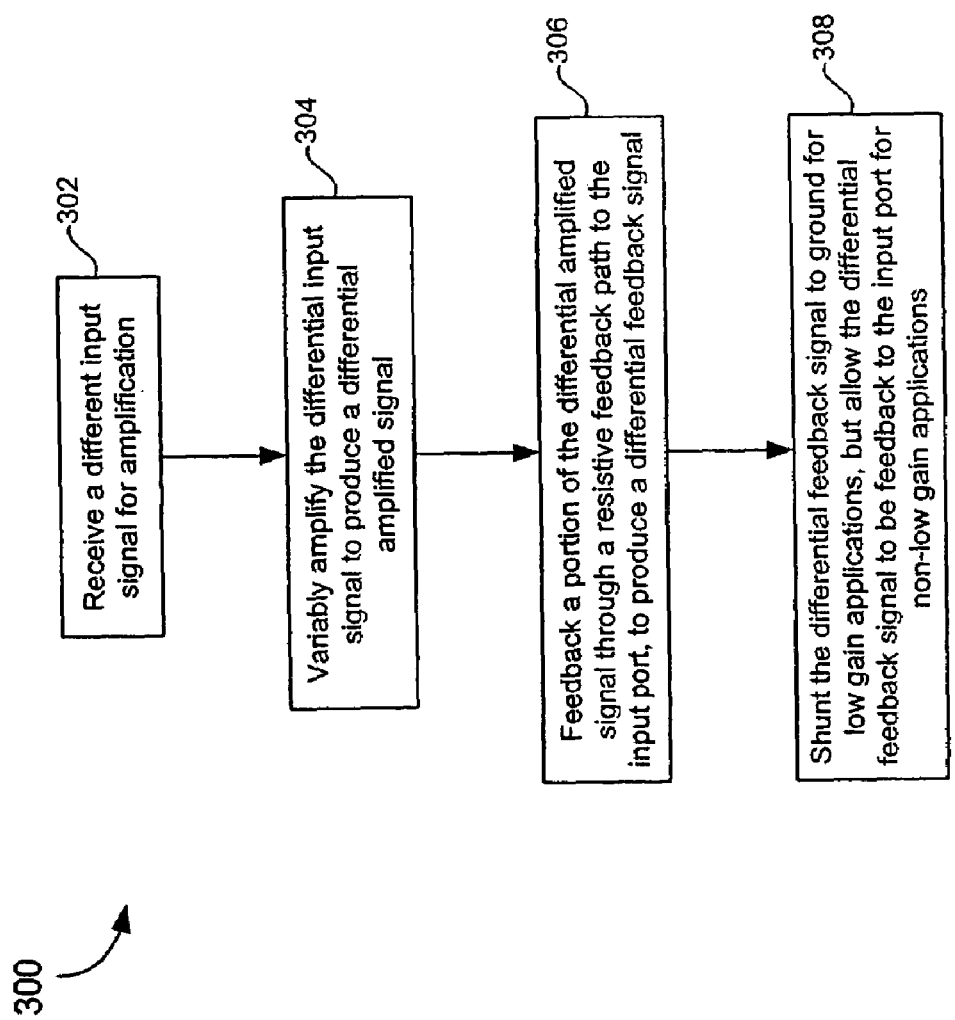
FIG. 3 illustrates a flowchart that further illustrates the operation of the invention.

FIG. 3 illustrates a flowchart 300 that further describes the functional operation of the invention according to embodiments of the invention.

In step 302, an input signal is received for amplification at an input port. For example, the input port 202 receives a differential input signal for amplification.

In step 304, the input signal is amplified to produce an amplified signal. For example, the forward amplifier 204 amplifies the differential input signal at the input port 202 to produce a differential output signal at the output port 206.

In step 306, a portion of the amplified signal is feedback through a resistive feedback path to the input port, so as to improve dynamic range. For example, the feedback amplifier 208 amplifies the differential output signal so as to produce a differential feedback signal.

In step 308, the feedback signal is shunted to ground, but only for low-gain applications. For example, the switch 212 shunts the differential feedback signal to virtual ground, by shorting together the differential components of the differential feedback signal. However, the feedback signal is allowed to be fed back for other non-low gain applications.

Figure 4:
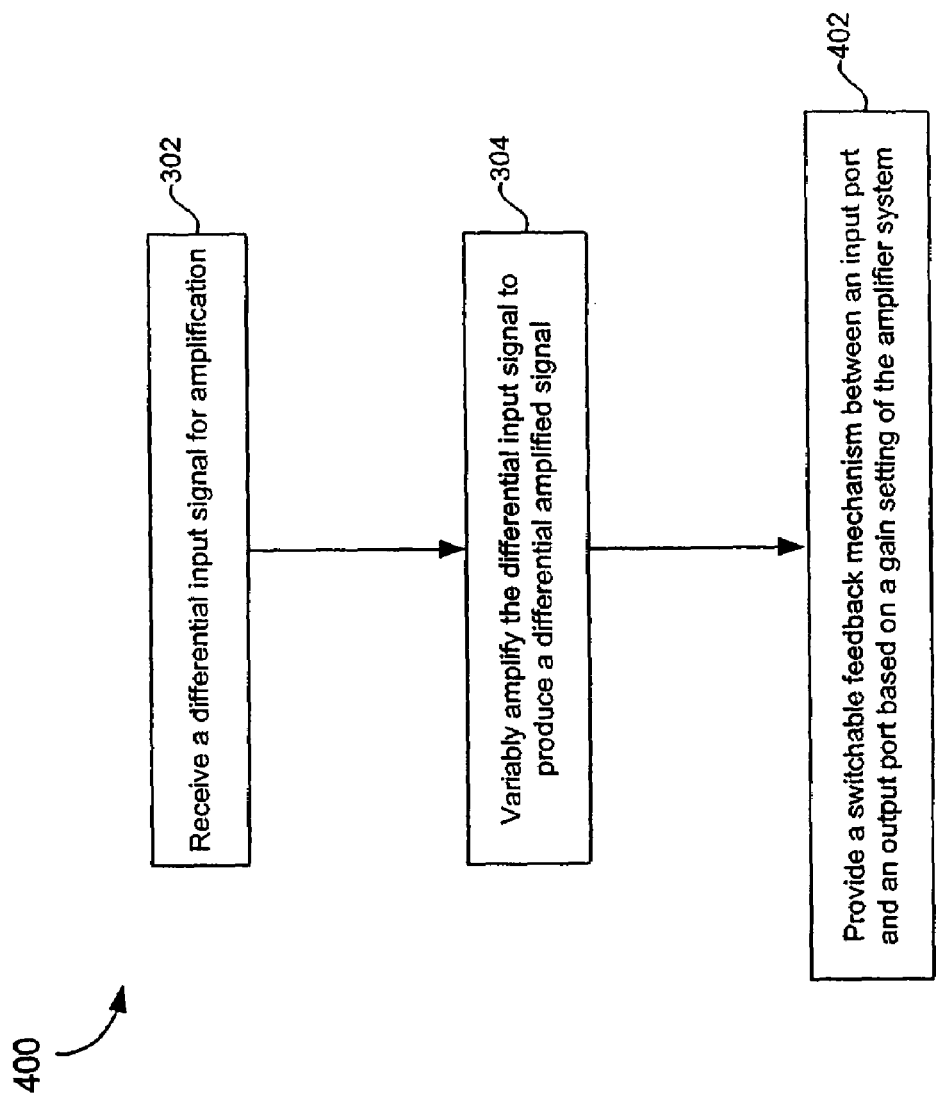
FIG. 4 illustrates a flowchart that further illustrates the operation of the invention.

FIG. 4 further illustrates another interpretation of the invention. In FIG. 4, steps 302 and 304 are the same as in FIG. 3. However, steps 306 and 308 are combined and redefined as step 402. In step 402, a switchable feedback mechanism is provided based on the gain setting of the amplifier system. For example, a switch is operated across the differential feedback path based on the specific gain setting of the amplifier system.

CONCLUSION

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. An amplifier, comprising:
a forward amplifier having an input and an output;
a feedback path coupled across said input and output, including,
a feedback amplifier coupled to an impedance; and
wherein a signal output of said feedback amplifier is selectively shunted to ground for low gain applications using a switch.

2. The amplifier of claim 1, wherein said impedance includes a first component impedance and a second component impedance, further comprising a switch inserted between said first component impedance and said second component impedance, said switch providing a connection to virtual ground when closed.

3. An amplifier, comprising:
a forward amplifier having an input and an output;
a feedback path coupled across said input and output, including,
a feedback amplifier coupled to an impedance;
wherein a signal output of said feedback amplifier is shunted to ground for low gain applications using a switch; and
wherein said feedback path is differential, and said switch is closed for low gain applications, and shorts a positive component to a negative component of said differential feedback path for low gain applications.

4. The amplifier of claim 3, wherein said switch is open for high gain applications, enabling a feedback signal corresponding to said feedback path to reach said input.

5. A variable gain differential amplifier, comprising:
a differential forward amplifier having a differential input and a differential output; and
a differential feedback path coupled across said differential input and said differential output;
wherein said differential feedback path is shorted together for low gain applications.

6. The variable gain differential amplifier of claim 5, wherein said differential feedback path includes:
a differential feedback amplifier;
a first differential resistor coupled to an output of said differential feedback amplifier; and
means for shorting a first terminal of said first differential resistor to a second terminal of said first differential resistor.

7. The variable gain differential amplifier of claim 6, further comprising:
a second differential resistor coupled said first differential resistor and to said differential input.

8. The differential amplifier of claim 6, wherein said means for shorting is implemented for low gain applications of said differential amplifier.

9. The differential amplifier of claim 6, wherein said means for shorting includes a switch coupled across differential terminals of said first differential resistor.

10. The differential amplifier of claim 9, wherein said switch is closed for low gain applications, so as to short-out a feedback signal associated with said feedback path for low gain applications.

11. The differential amplifier of claim 10, wherein said feedback signal is terminated in said first differential resistor.

12. The differential amplifier of claim 10, wherein said switch includes a control terminal that is activated for low gain applications.

13. The differential amplifier of claim 6, wherein said first differential resistor has a pair of component resistors, said switch coupled across corresponding terminals of said pair of component resistors.

14. The differential amplifier of claim 6, wherein said differential forward amplifier provides a variable gain, wherein said means for shorting includes a switch that is closed for low gain applications of said differential amplifier, wherein said switch is opened for other applications of said differential amplifier.

15. A method of variably amplifying a differential input signal, comprising:
receiving a differential input signal at an input terminal;
variably amplifying the differential input signal to produce a differential amplified signal at an output;
feeding back a portion of the differential amplified signal through a feedback path that is coupled to the input terminal to produce a differential feedback signal; and
shorting together components of the differential feedback signal for low gain applications.

* * * * *